(12) United States Patent
Seo et al.

(10) Patent No.: US 7,393,769 B2
(45) Date of Patent: Jul. 1, 2008

(54) TRANSISTOR OF A SEMICONDUCTOR DEVICE HAVING A PUNCHTHROUGH PROTECTION LAYER AND METHODS OF FORMING THE SAME

(75) Inventors: Hyeoung-Won Seo, Gyeonggi-do (KR); Ki-Nam Kim, Gyeonggi-do (KR); Woun-Suck Yang, Gyeonggi-do (KR); Du-Heon Song, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 406 days.

(21) Appl. No.: 11/077,835

(22) Filed: Mar. 10, 2005

(65) Prior Publication Data

US 2005/0199930 A1    Sep. 15, 2005

(30) Foreign Application Priority Data

Mar. 10, 2004    (KR)    ............ 10-2004-0016272

(51) Int. Cl.
*H01L 29/40*    (2006.01)
(52) U.S. Cl. ............... 438/589; 438/734; 257/E21.429
(58) Field of Classification Search ........... 438/589, 438/692, 719, 723, 724, 734, 751, 753, 756, 438/757; 257/E21.429, E29.267
See application file for complete search history.

(56) References Cited

U.S. PATENT DOCUMENTS 6,031,261 A *   2/2000   Kang .................... 257/302
6,423,618 B1    7/2002   Lin et al.

FOREIGN PATENT DOCUMENTS

| JP | 09-045904 | 2/1997 |
|---|---|---|
| KR | 2002-0032934 | 5/2002 |
| KR | 2002-0044861 | 6/2002 |

OTHER PUBLICATIONS

English language abstract of Japanese Publication No. 09-045904.
English language abstract of Korean Publication No. 2002-0032934.
English language abstract of Korean Publication No. 2002-0044861.

* cited by examiner

*Primary Examiner*—Thomas L Dickey
(74) *Attorney, Agent, or Firm*—Marger Johnson & McCollom, P.C.

(57) ABSTRACT

According to some embodiments of the invention, transistors of a semiconductor device have a punchthrough protection layer, and methods of forming the same are provided. A channel-portion hole extends downward from a main surface of a semiconductor substrate. A punchthrough protection layer and a channel-portion layer are sequentially formed at a lower portion of the channel-portion hole. A word line pattern fills an upper portion of the channel-portion hole, and is formed on the semiconductor substrate. The word line pattern is formed to have a word line and a word line capping layer pattern stacked thereon, and the channel-portion layer is a channel region. The punchthrough protection layer can reduce a leakage current of a capacitor of the transistor embodied in a DRAM.

23 Claims, 16 Drawing Sheets

US 7,393,769 B2

TRANSISTOR OF A SEMICONDUCTOR DEVICE HAVING A PUNCHTHROUGH PROTECTION LAYER AND METHODS OF FORMING THE SAME

CROSS-REFERENCE TO RELATED APPLICATION

This patent application claims priority from Korean Patent Application No. 10-2004-0016272, filed Mar. 10, 2004, the contents of which are hereby incorporated by reference in their entirety.

BACKGROUND OF INVENTION

1. Technical Field

The invention relates to transistors of a semiconductor device and methods of forming the same, and more particularly, to transistors of a semiconductor device having a punchthrough protection layer and methods of forming the same.

2. Discussion of the Related Art

Generally, a transistor includes a word line pattern, source/drain regions and a channel region. The channel region is disposed in the semiconductor substrate under the word line pattern, and the source/drain regions are disposed in the semiconductor substrate so that they overlap the word line pattern. The word line pattern is also disposed on the semiconductor substrate along with the source/drain regions and the channel region. The channel region as well as the word line pattern are reduced in size with reduction of a design rule of a semiconductor device. This reduction tends to create problems, such as a punchthrough between the source and the drain region, as explained below.

To cope with these problems, there has been much research on the semiconductor device to improve characteristics in spite of the reduction of the design rule. One research effort proposes a transistor including a channel-portion hole disposed in the semiconductor substrate, and a word line pattern filling the channel-portion hole. The channel-portion hole has a trench shape. The word line pattern provides a channel region along the semiconductor substrate defining the channel-portion hole. The channel region around the channel-portion hole is longer in length than that of the channel region under the word line pattern on the semiconductor substrate.

However, although the transistor having the channel-portion hole can increase an integration degree of a semiconductor device with the increase of the length of the channel region, a punchthrough between the source region and the drain region associated with the reduction of the design rule is not improved. This is because the reduction of the design rule of the semiconductor device decreases a diameter of the channel-portion hole and concurrently decreases the distance between the source region and the drain region along the channel region around the channel-portion hole. Therefore, the transistor having the channel-portion hole requires a method of improving the punchthrough of the source and the drain regions.

On the other hand, U.S. Pat. No. 6,423,618 to Ming-Jang Lin, et al. (the '618 patent) discloses methods of manufacturing a trench gate structure.

According to the '618 patent, the method includes sequentially forming an epitaxial layer, and a first and a second dielectric layer on a semiconductor substrate. The epitaxial layer has a base region and a source region overlapping the base region. A trench is formed in the epitaxial layer to sequentially penetrate the source and the base regions along with the second and the first dielectric layers.

The method includes forming a third dielectric layer at a lower portion of the trench, and forming a gate oxide layer conformably covering the trench. A polysilicon layer is formed on the second dielectric layer to conformably cover the trench, and a fourth dielectric layer is formed on the polysilicon layer to fill the trench. Subsequently, the fourth dielectric layer and the polysilicon layer are partially removed so that the base region has the same level as the fourth dielectric layer and the polysilicon layer.

However, the method includes performing an etching process on the epitaxial layer to form a transistor having a trench gate structure. The transistor may have an unstable interfacial state along the epitaxial layer defining the trench due to the etching process. The unstable interface of the epitaxial layer becomes a part of a channel region of the transistor, thereby causing a leakage current during the operation of the semiconductor device. Further, the method discloses a method of forming a transistor using different oxide layers on a bottom and a sidewall of the trench as the gate oxide layer, but the oxide layers inside the trench may increase the leakage current and decrease a breakdown voltage of the gate oxide layer due to the different oxide layers.

SUMMARY OF THE INVENTION

According to some embodiments of the invention, transistors of a semiconductor device and a DRAM cell have a punchthrough protection layer in a channel-portion hole, suitable for preventing the punchthrough of a source and a drain region of a transistor.

Methods of forming the transistors are provided in the embodiments.

BRIEF DESCRIPTION OF THE DRAWINGS

Exemplary embodiments of the invention will be readily apparent to those of ordinary skill in the art upon review of the detailed description that follows when taken in conjunction with the accompanying drawings, in which like reference numerals denote like parts.

DETAILED DESCRIPTION OF THE INVENTION

Figure 1:
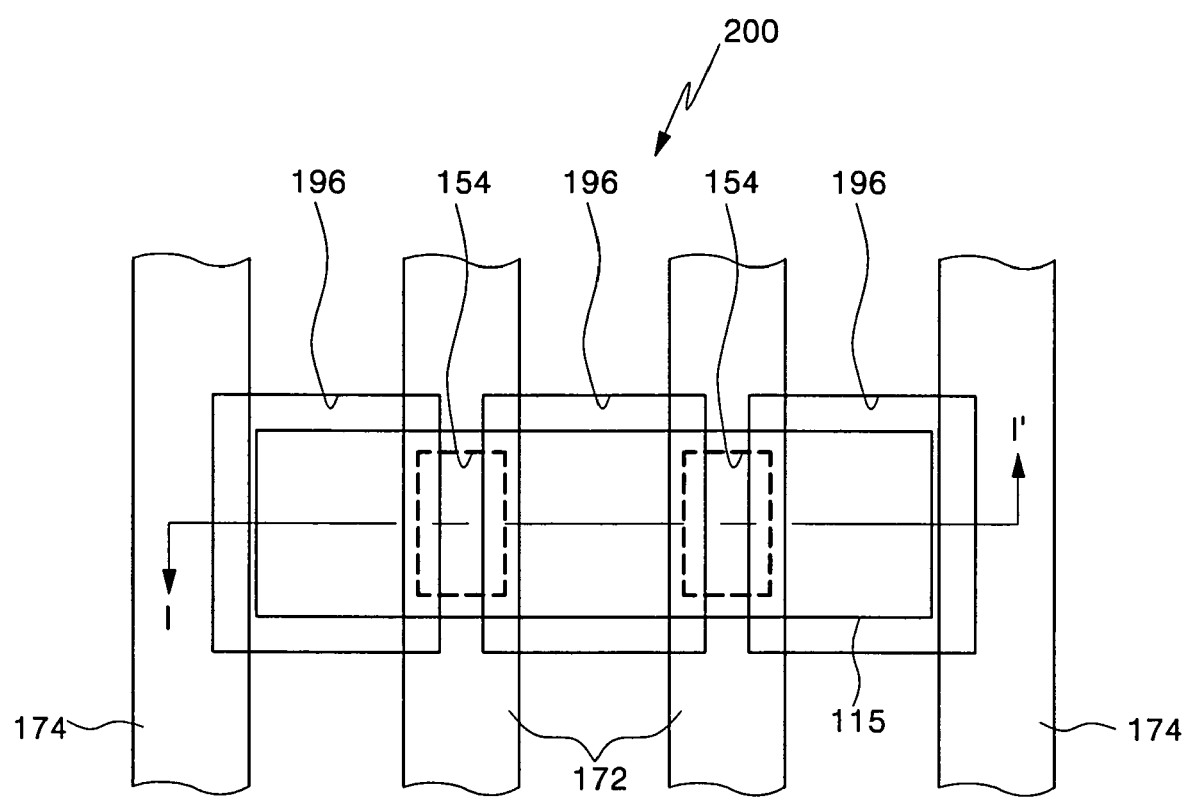
FIG. 1 is a layout of a transistor of a DRAM cell according to exemplary embodiments of the invention.
Figure 2:
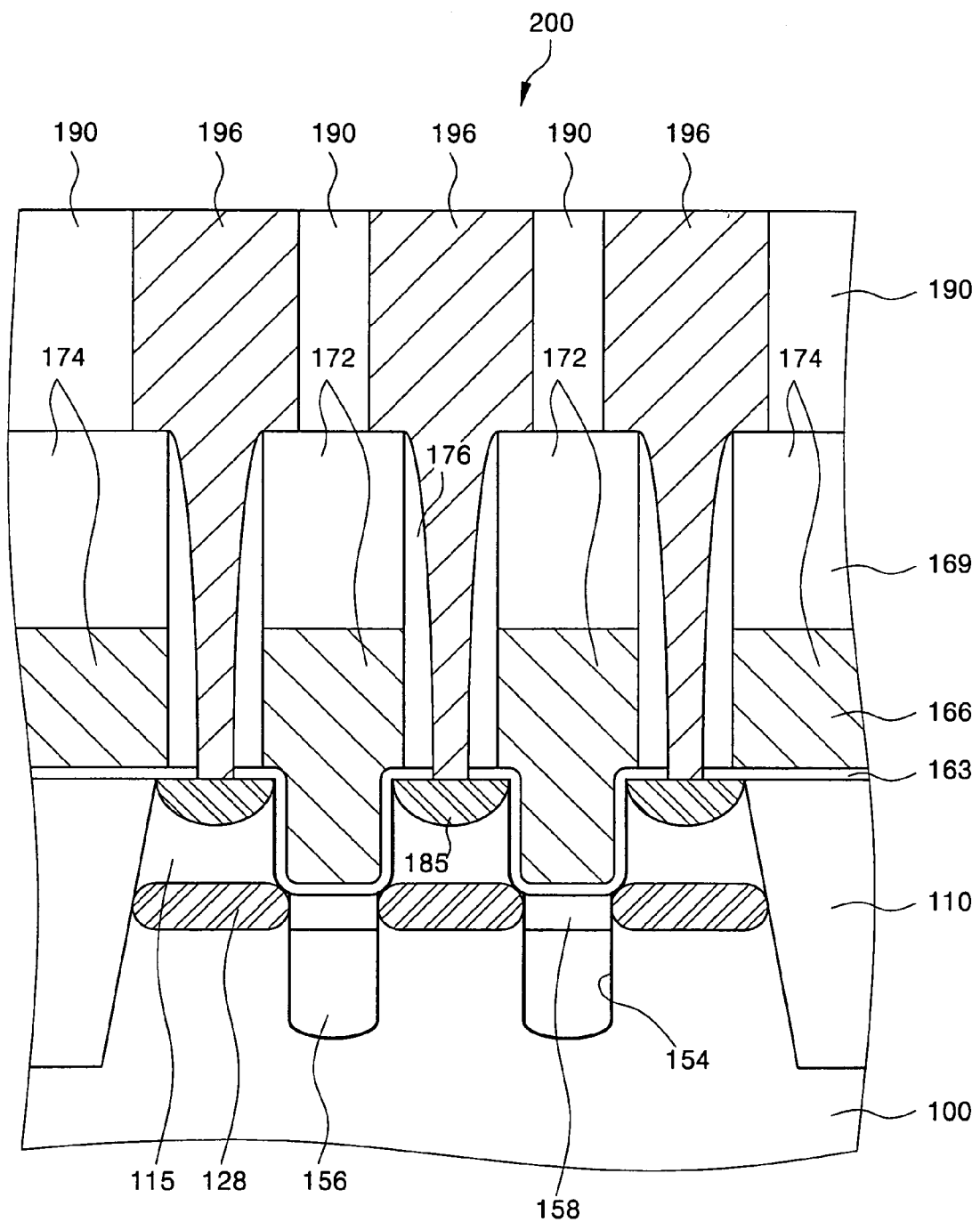
FIG. 2 is a sectional view of a transistor of a DRAM cell taken along line I-I' of FIG. 1.
Figure 3:
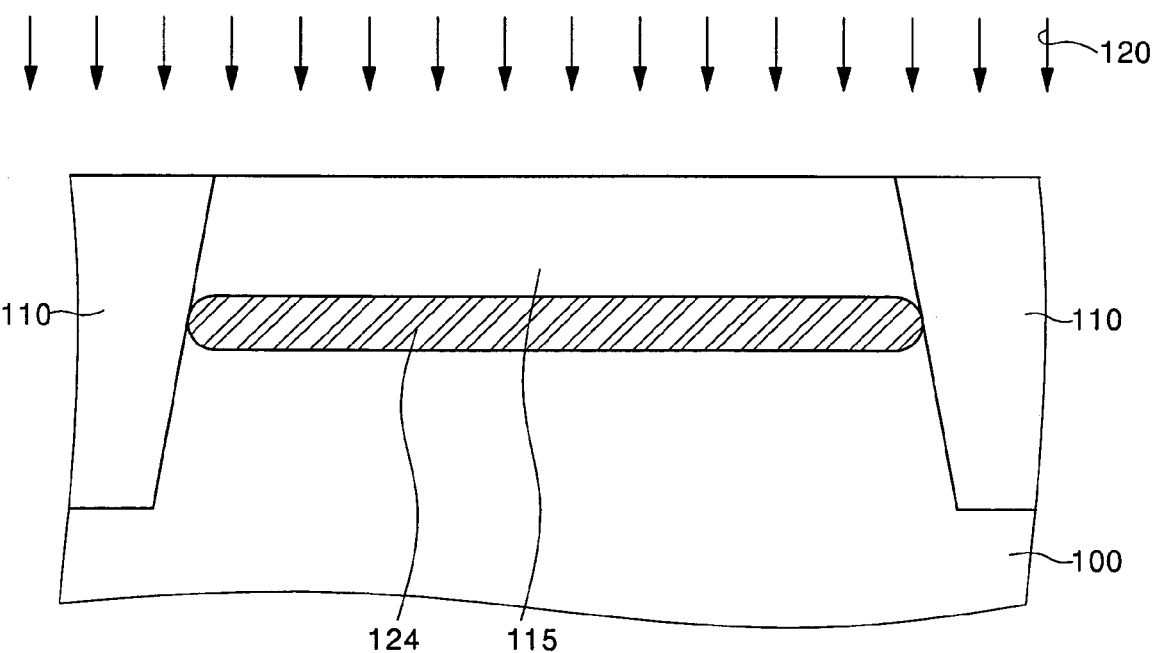
FIGS. 3 through 16 are sectional views illustrating a method of forming a transistor of a DRAM cell taken along line I-I' of FIG. 1, respectively.
Figure 4:
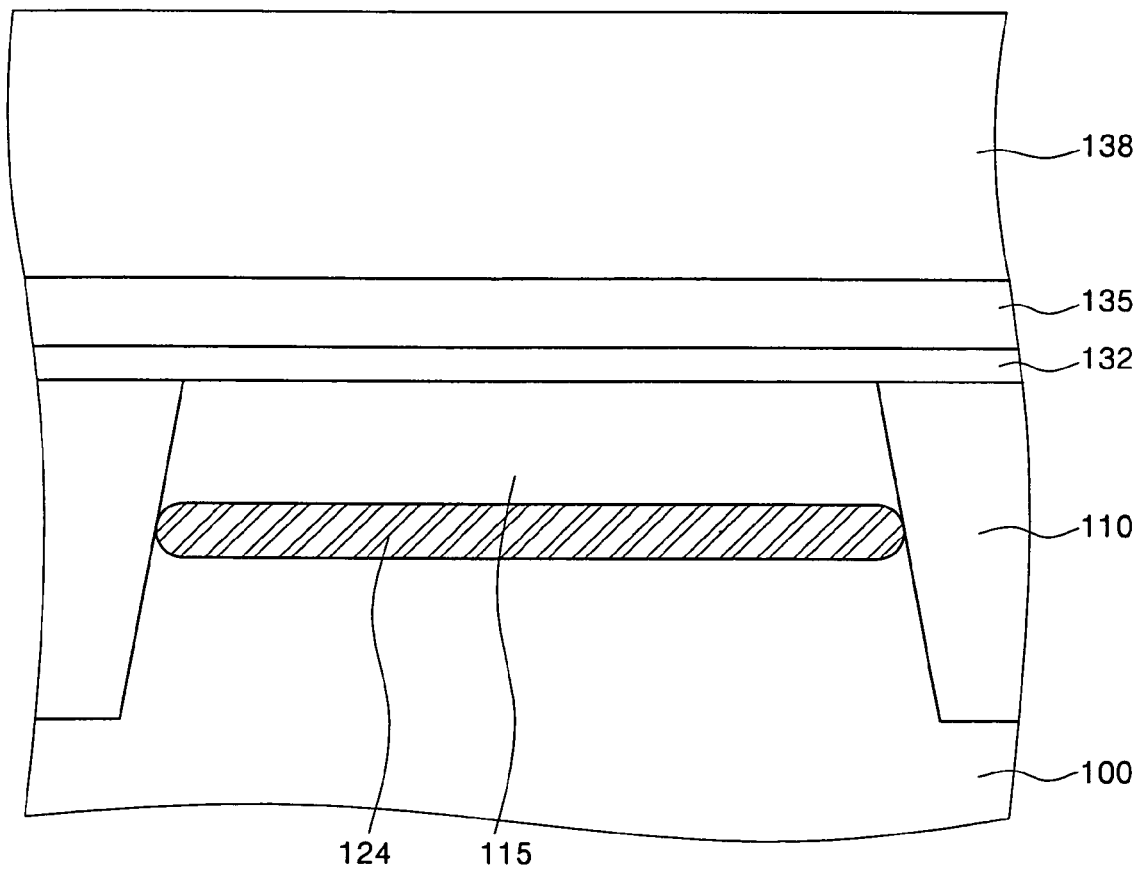
Figure 5:
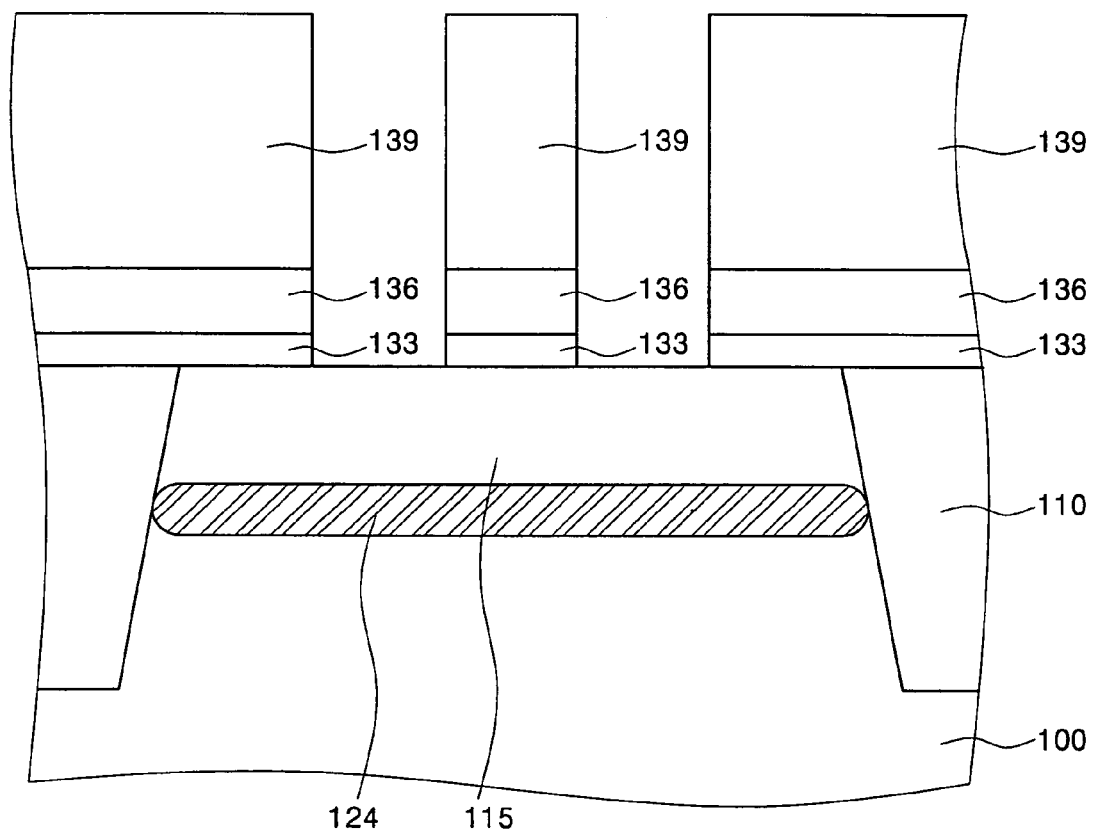
Figure 6:
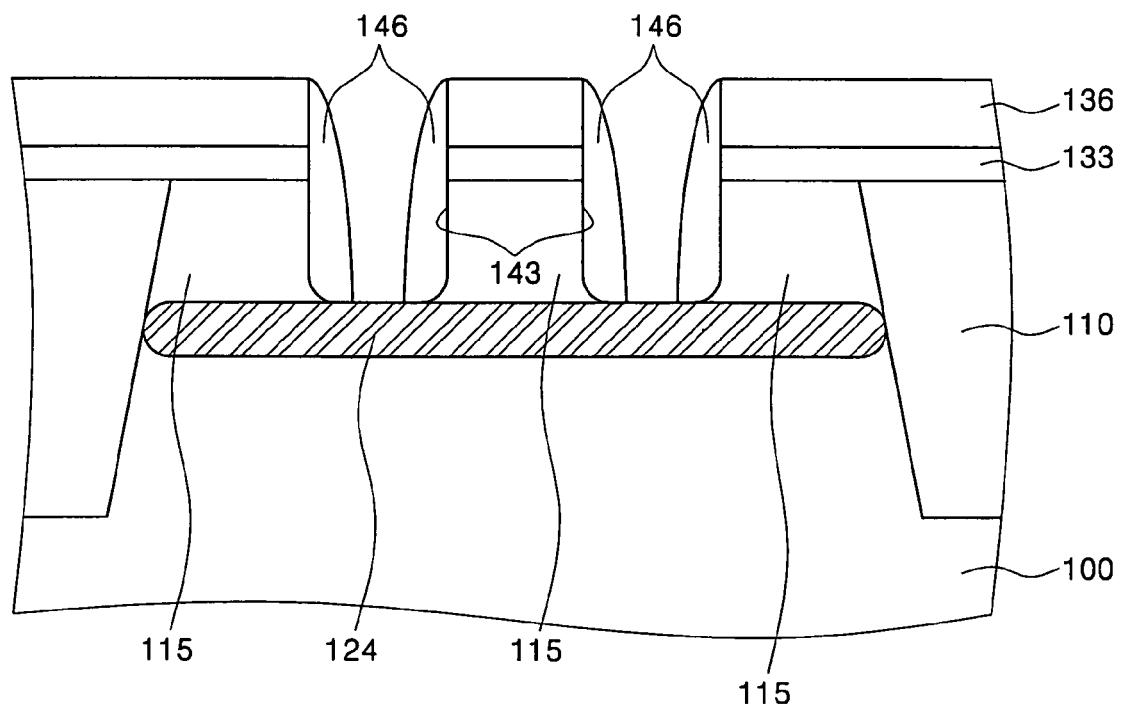
Figure 7:
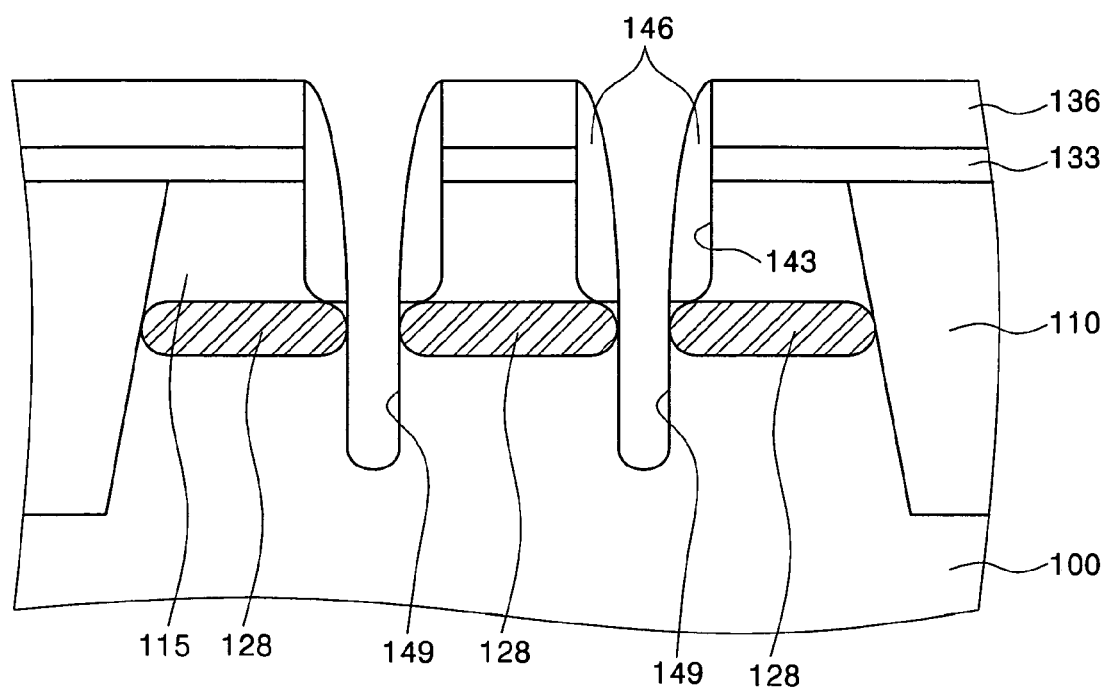
Figure 8:
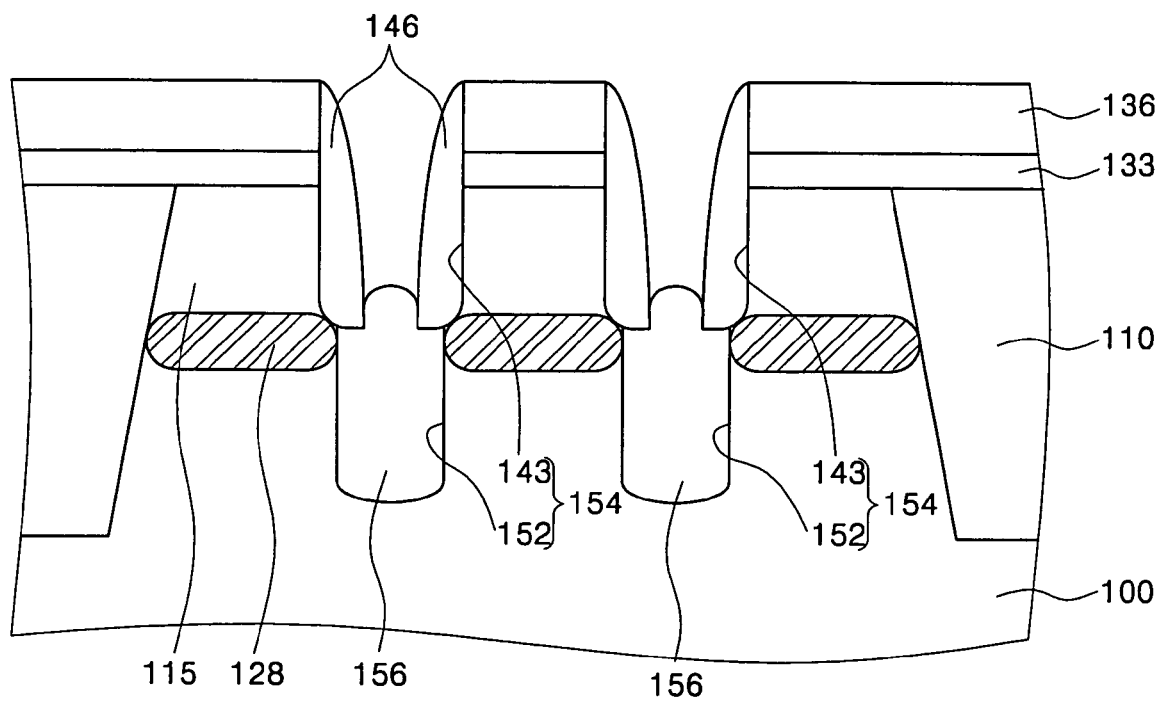
Figure 9:
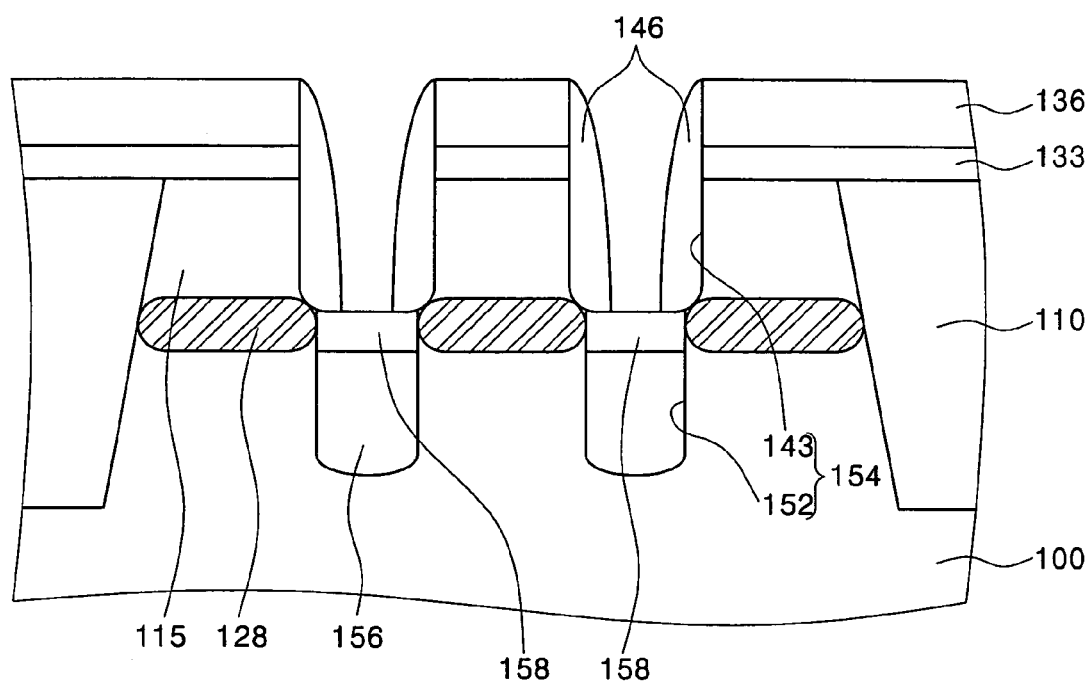
Figure 10:
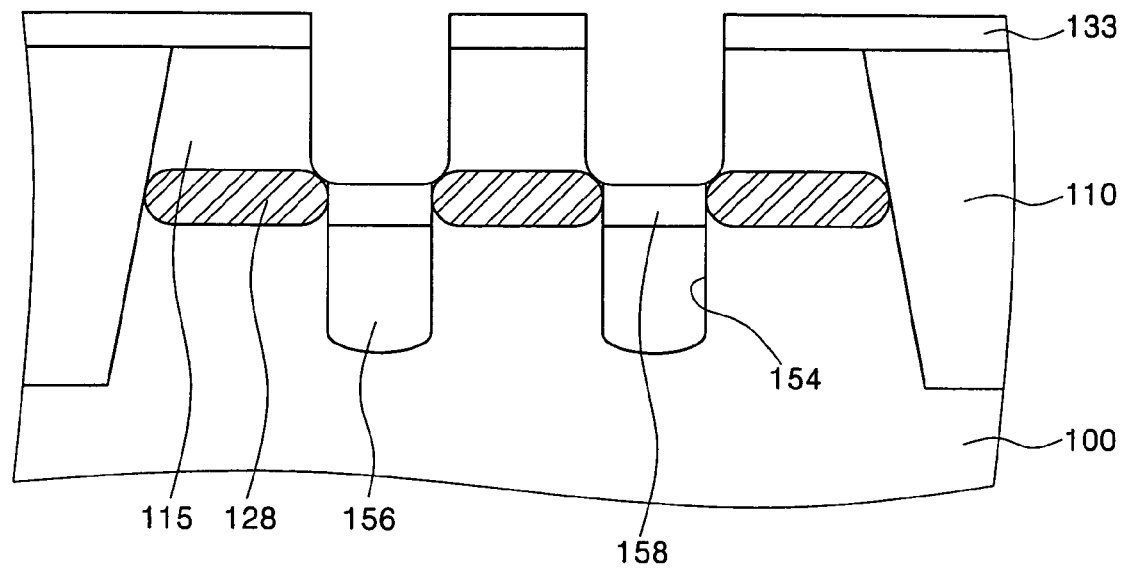
Figure 11:
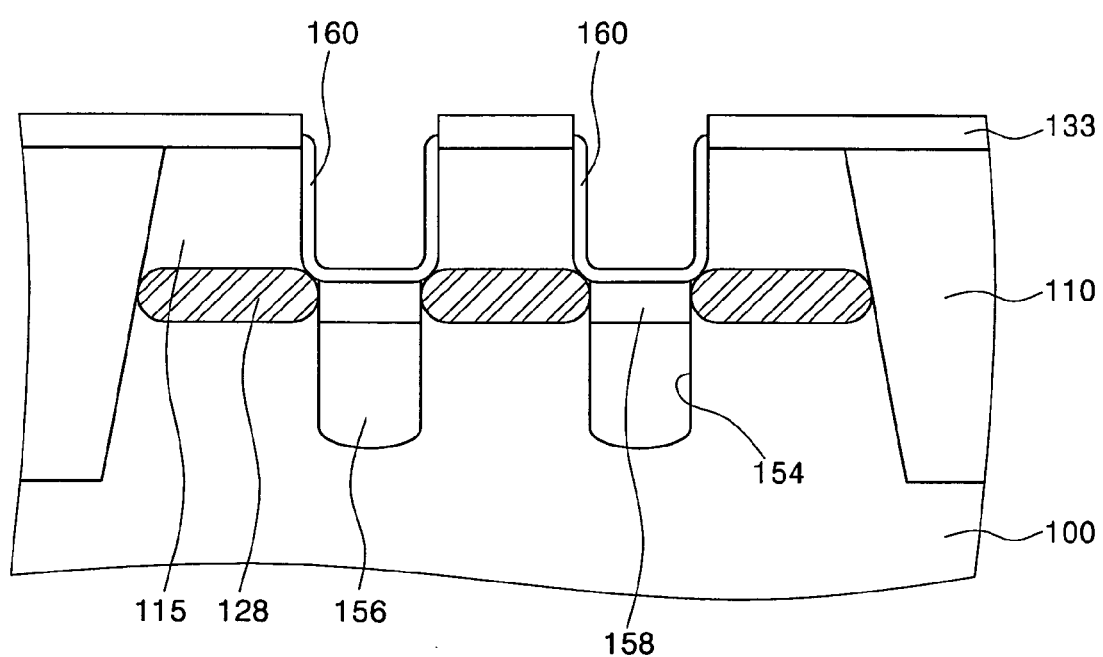
Figure 12:
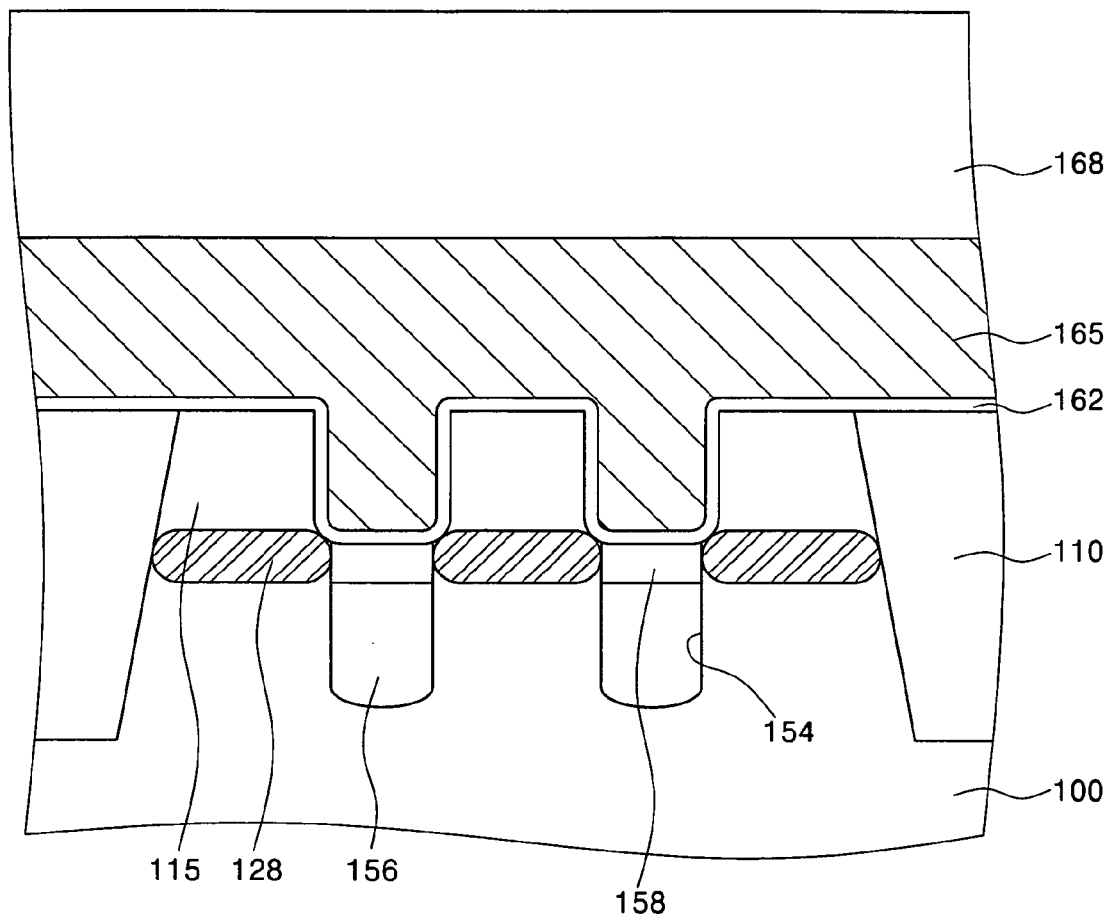
Figure 13:
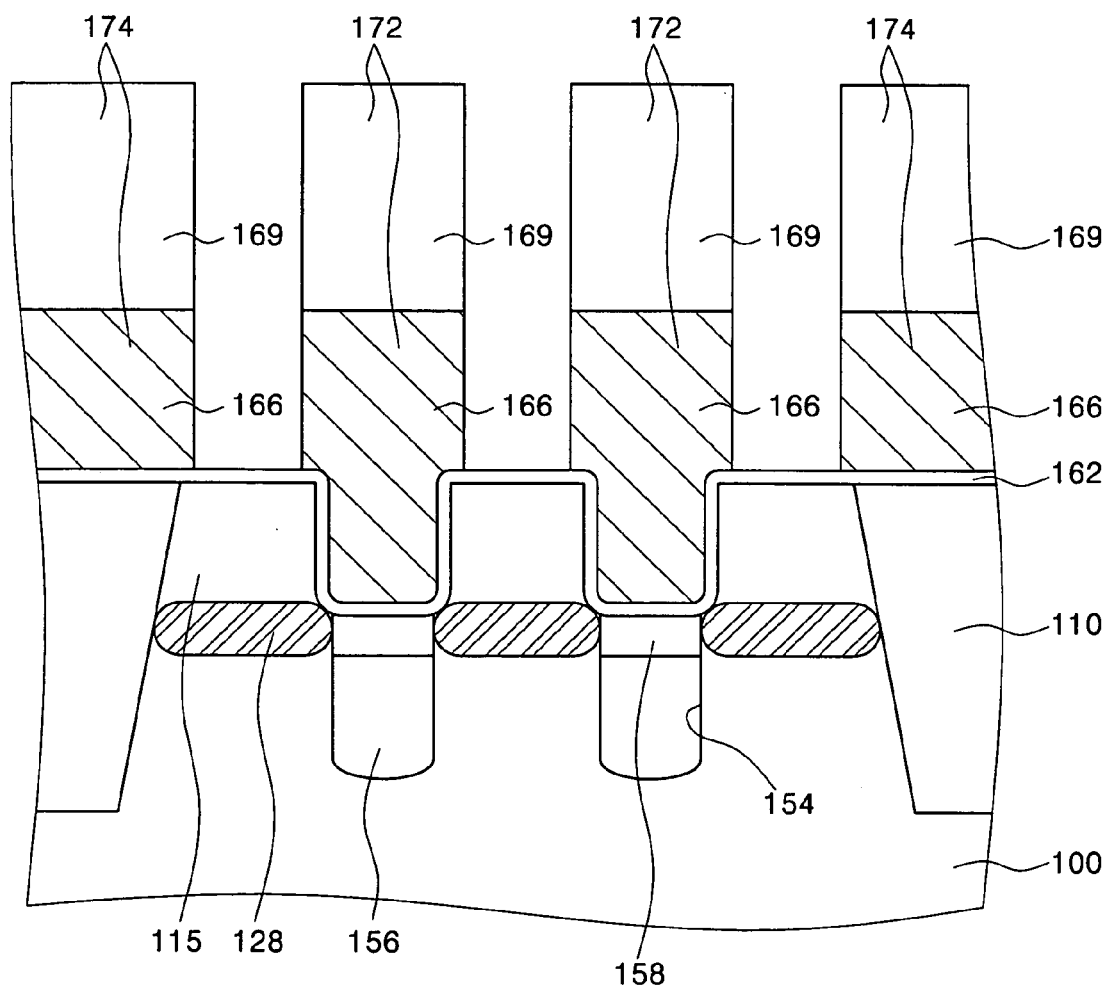
Figure 14:
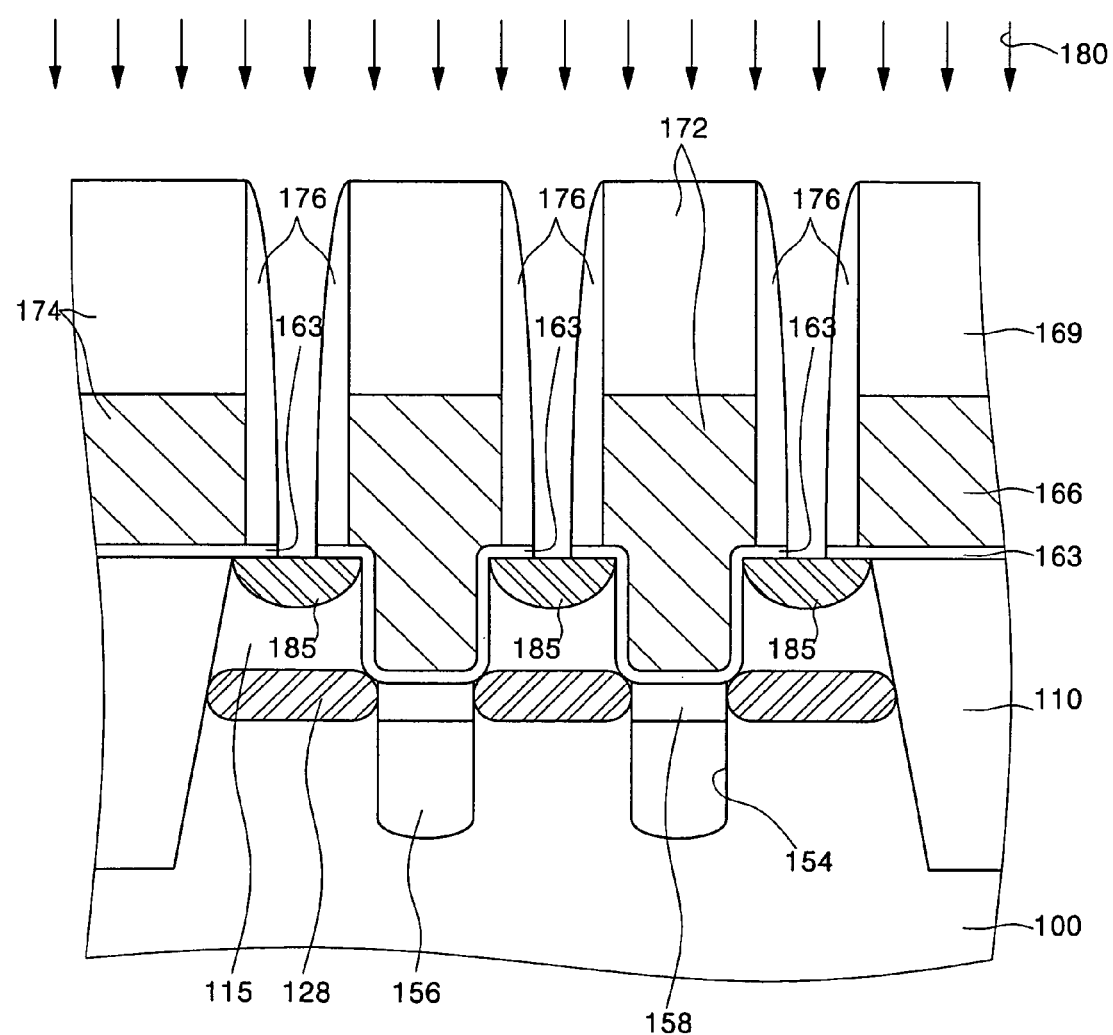

FIG. 1 is a layout of a transistor of a DRAM cell according to exemplary embodiments of the invention, and FIG. 2 is a sectional view of a transistor of a DRAM cell taken along line I-I' of FIG. 1.

Referring to FIGS. 1 and 2, a device isolation layer 110 is disposed in a semiconductor substrate 100 having a DRAM cell array region 200. The device isolation layer 110 isolates an active region 115. The semiconductor substrate 100 preferably has a P conductivity type, but the semiconductor substrate 100 may instead have an N conductivity type.

At least two channel-portion holes 154 are disposed extending downward from a main surface of the semiconductor substrate 100 of the active region 115, and each of the channel-portion holes 154 has a trench shape. Upper portions of the channel-portion holes 154 are preferably greater in width than lower portions thereof. Alternatively, the upper portions of the channel-portion holes 154 may be smaller in width than the lower portions thereof, or the upper portions and the lower portions of the channel-portion holes 154 may be the same in width.

Each of the channel-portion holes 154 has a punchthrough protection layer 156 and a channel-portion layer 158 stacked thereon at its lower portion. Word line insulating layer patterns 163 are disposed on the channel-portion layer 158 and conformably cover the channel-portion holes 154, respectively. The channel-portion layer 158 contacts the semiconductor substrate 100 through sidewalls of each of the channel-portion holes 154 with a predetermined width. The word line insulating layer pattern 163 and the punchthrough protection layer 156 preferably are an insulating layer having an etching ratio different from that of the semiconductor substrate, for example, a silicon oxide ($SiO_2$). The word line insulating layer pattern 163 may be a silicon oxynitride ($Si_xN_yO_z$). Further, the channel-portion layer 158 is an insulating layer having the same etching ratio as the semiconductor substrate, for example, an epitaxial layer. In the embodiment the channel-portion layer 158 has a P conductivity type. In a peripheral circuit region except the DRAM cell array region 200, the channel-portion layer 158 may have a P or an N conductivity type. The channel-portion layer 158 may be an undoped epitaxial layer in the DRAM cell array region 200 and the peripheral circuit region.

Channel impurity division regions 128 are disposed between the channel-portion holes 154, respectively, and contact the channel-portion layers 158. The channel impurity division regions 128 are not necessarily disposed between the channel-portion holes 154 if a transistor can sufficiently prevent the punchthrough of the source and the drain regions by using the punchthrough protection layer 156. The channel impurity division regions 128 have impurity ions having the same conductivity type as the semiconductor substrate 100.

First word line patterns 172 are disposed on the word line insulating layer patterns 163, and the first word line patterns 172 fill the upper portions of the channel-portion holes 154, respectively, and are disposed in parallel and spaced away from each other on the active region 115. Second word line patterns 174 are disposed on the device isolation layer 110. Each of the second word line patterns 174 is disposed adjacent to the active region 115, and in parallel and opposite to at least one of the first word line patterns 172. Each of the first word line patterns 172 and the second word line patterns 174 includes a word line 166 and a word line capping layer pattern 169 stacked thereon. The word lines 166 of each of the first word line patterns 172 is disposed on each of the channel-portion layers 158 and fill each of the channel-portion holes 154. Each of the channel-portion layers 158 forms a channel region of the transistor under the first word line pattern 172. The word line 166 includes polysilicon having an N conductivity type and a metal silicide layer stacked thereon. Alternatively, the word line 166 may be polysilicon having an N conductivity type. The polysilicon preferably has a conductivity type different from the semiconductor substrate 100. In the peripheral circuit region except for the DRAM cell array region 200, the polysilicon may have the same conductivity type as the semiconductor substrate 100, or may have a conductivity type different from the semiconductor substrate 100. The word line capping layer pattern 169 preferably is an insulating layer having an etching ratio different from that of the word line insulating layer pattern 163, for example, a silicon nitride ($Si_3N_4$).

Word line spacers 176 are disposed on sidewalls of the first and the second word line patterns 172, 174, respectively. The word line insulating layer patterns 163 are preferably disposed under the word line spacers 176 as well as under the first and the second word line patterns 172, 174, respectively. The word line spacers 176 preferably are an insulating layer having the same etching ratio as the word line capping layer pattern 169.

Electrode impurity regions 185 are disposed under the main surface of the semiconductor substrate 100 between the first and the second word line patterns 172, 174, and the electrode impurity regions 185 overlap the first and the second word line patterns 172, 174. The electrode impurity regions 185 contact the channel-portion holes 154, respectively. The electrode impurity regions 185 preferably have a conductivity type different from that of the semiconductor substrate 100. The electrode impurity regions 185 refer to a source and a drain region of the transistor, respectively.

Plug patterns 196 are disposed between the first and the second word line patterns 172, 174, and extend upward from upper surfaces of the first and the second word line patterns 172, 174. Each of the plug patterns 196 are isolated by an interlayer insulating layer 190. The interlayer insulating layer 190 preferably is an insulating layer having an etching ratio different from that of the word line spacer 176. Upper portions of the plug patterns 196 are surrounded by the interlayer insulating layer 190, whereas lower portions of the plug patterns 196 are spaced apart by the first word line patterns 172 so that they are electrically insulated from each other. Further, the plug patterns 196 are disposed on the semiconductor substrate 100, so that they contact the electrode impurity regions 185, respectively. The plug patterns 196 preferably have the same conductivity type as the electrode impurity regions 185. The plug patterns 196 between two consecutive first word line patterns 172 is a bit-line node, and the other plug patterns 196 between the first and the second word line patterns 172, 174 are capacitor nodes, respectively.

As a result, embodiments of the invention provide a transistor including the plug patterns 196, the electrode impurity regions 185, the channel-portion layers 158, and the first and the second word line patterns 172, 174. That is, the first and the second word line patterns 172, 174 are gates of the transistor, respectively, and the channel-portion layers 158 are channel regions of the transistor, respectively. Further, the electrode impurity regions 185 are source and drain regions of the transistor, respectively, and the plug patterns 196 are electrical nodes of the source and the drain regions of the transistor, respectively. Further, the punchthrough protection layer 156 disposed in the lower portion of the channel-portion hole 154 functions to physically prevent the punchthrough between the source and the drain regions of the transistor.

Hereinafter, methods of forming transistors according to embodiments of the invention will be described in reference to attached drawings.

FIGS. 3 through 16 are sectional views illustrating a method of forming a transistor of a DRAM cell taken along line I-I' of FIG. 1, respectively.

Referring to FIG. 1 and FIGS. 3 through 5, a device isolation layer 110 is formed in a semiconductor substrate 100 of a DRAM cell array region 200 to isolate an active region 115. The device isolation layer 110 is preferably formed of an insulating layer having an etching ratio different from that of the semiconductor substrate 100, for example, a silicon oxide ($SiO_2$). The semiconductor substrate 100 preferably has a P conductivity type, or the semiconductor substrate 100 may have an N conductivity type.

By using the device isolation layer 110 as a mask, an ion implantation process 120 is performed in the semiconductor substrate 100 to form a channel impurity region 124. The channel impurity region 124 is formed by using the impurity ions having the same conductivity type as the semiconductor substrate 100, and the channel impurity region 124 is formed to have a dose higher than that of the semiconductor substrate 100.

A pad layer 132, a reflective layer 135, and a photoresist layer 138 are sequentially formed on the semiconductor substrate having the channel impurity region 124. The reflective layer 135 may not be formed if fine photoresist patterns are formed by a photolithography process. The reflective layer 135 is formed of an insulating layer having an etching ratio different from the pad layer 132, for example, a silicon oxynitride (SiON). The pad layer 132 is preferably formed of a silicon oxide ($SiO_2$), and the pad layer 132 may also be formed of a silicon nitride ($Si_3N_4$).

A photolithography process is performed in the photoresist layer 138 to form photoresist patterns 139 on the reflective layer 135. By using the photoresist patterns 139 as an etching mask, an etching process is performed on the reflective layer 135 and the pad layer 132 to expose the main surface of the semiconductor substrate 100 of the active region 115. The etching process forms pad layer patterns 133 and reflective layer patterns 136 stacked thereon on the semiconductor substrate 100.

Referring to FIG. 1 and FIGS. 6 through 8, the photoresist patterns 139 are removed from the semiconductor substrate 100, and by using the reflective layer patterns 136 and the pad layer patterns 133 as an etching mask, an etching process is performed in the semiconductor substrate 100 to form at least two channel holes 143. Channel spacers 146 are formed on sidewalls of the pad layer patterns 133 and the reflective layer patterns 136 at bottoms of the channel holes 143. The channel spacers 146 expose the bottoms of the channel holes 143, respectively. At this time, the channel holes 143 are formed to expose the channel impurity regions 124, respectively, or may be not formed to expose the channel impurity regions 124. The channel spacer 146 is preferably formed of an insulating layer having the same etching ratio as the reflective layer pattern 136, for example, a silicon nitride ($Si_3N_4$).

By using the channel spacers 146, the reflective layer patterns 136 and the pad layer patterns 133 as an etching mask, an etching process is performed in the semiconductor substrate 100 to form channel trenches 149. The channel trenches 149 are formed to extend downward from the bottom of the channel holes 143, respectively. The channel trenches 149 are formed to traverse the channel impurity region 124, respectively, so that channel impurity division regions 128 are formed under the channel holes 143, respectively. The channel trench 149 is preferably formed greater in depth than the channel hole 143. The channel trench 149 may be formed smaller in depth than the channel hole 143, or the same depth as the channel hole 143.

An oxidation process is performed on the semiconductor substrate having the channel impurity division regions 128 to form punchthrough protection layers 156 filling the channel trenches 149, respectively. The punchthrough protection layers 156 function to prevent the punchthrough of the source and the drain regions of the transistor. By the oxidation process, each of the punchthrough protection layers 156 increases widths of the channel trenches 149 to form channel-portion trenches 152. The channel-portion trenches 152 are formed under the channel holes 143 respectively by using the interface between the semiconductor substrate 100 and the punchthrough protection layer 156. The channel-portion trench 152 and the channel hole 143 form one channel-portion hole 154. The channel-portion trench 152 is preferably formed greater in width than that of the channel hole 143. The channel-portion trench 152 may also be formed smaller in width than that of the channel hole 143, or the same width as that of the channel hole 143. The punchthrough protection layer 156 is preferably formed of an insulating layer having an etching ratio different from the channel spacer 146, for example, a silicon oxide ($SiO_2$).

Referring to FIG. 1 and FIGS. 9 through 11, by using the reflective layer patterns 136 and the channel spacers 146 as an etching stop layer, an etching process is performed on the punchthrough protection layers 156. The etching process is performed to partially etch the punchthrough protection layers 156 and expose the semiconductor substrate 100 defining upper portions of the channel-portion trenches 152. Further, side portions of the channel impurity division regions 128, which are respectively in contact with the upper portions of the channel-portion trenches 152, are exposed. The etching process may be performed by using a dry etch or a wet etch.

An epitaxial process is performed on the punchthrough protection layer 156 by using the reflective layer patterns 136 and the channel spacers 146 as growth stop layers to form channel-portion layers 158 filling the upper portions of the channel-portion trenches 152 respectively. The channel-portion layers 158 are formed under the channel holes 143, respectively, and are preferably formed of an insulating layer having the same etching ratio as that of the semiconductor substrate 100, for example, an epitaxial layer. The channel-portion layer 158 may be formed of an undoped epitaxial layer, or an epitaxial layer having a P conductivity type. The channel-portion layer 158 may be formed of an epitaxial layer having a P or an N conductivity type in the peripheral circuit region except the DRAM cell array region 200.

An etching process is sequentially performed on the semiconductor substrate having the channel-portion layers 158 to remove the reflective layer patterns 136 and the channel spacers 146 from the semiconductor substrate 100. As such, the pad layer patterns 133 singly remain on the main surface of the semiconductor substrate 100. After removing the channel spacers 146 and the reflective layer patterns 136, by using the pad layer patterns 133 as an oxidation stop layer, an oxidation process is performed on the sidewalls of the upper portions of the channel-portion holes 154 and on the channel-portion layers 158 to form sacrificial layers 160, respectively. The sacrificial layers 160 are preferably formed of an insulating layer having an etching ratio different from that of the reflective layer 136, for example, a silicon oxide ($SiO_2$). The sacrificial layers 160 function to stabilize the unstable interface state due to the etching process during the formation of the channel holes 143. The impurity ions of the channel impurity division regions are diffused into the channel-portion layers by heat during the epitaxial process and the oxidation process.

Referring to FIG. 1 and FIGS. 12 through 14, the sacrificial layers 160 and the pad layer patterns 133 are removed from the semiconductor substrate 100. A word line insulating layer 162, a word line layer 165 and a word line capping layer 168 are sequentially formed on the channel-portion layers 158 and the semiconductor substrate 100 to fill the upper portions of the channel-portion holes 154. Preferably, the word line capping layer 168 is formed of an insulating layer having the same etching ratio as that of the channel spacer 146, and the word line insulating layer 162 is formed of an insulating layer having an etching ratio different from that of the channel-portion layer 158, for example, a silicon oxide ($SiO_2$). The word line insulating layer 162 may be formed of a silicon oxynitride ($Si_xN_yO_z$), and is formed on the channel-portion layers 158 to conformably cover the sidewalls of the upper portions (channel holes) of the channel-portion holes 154, and concurrently to cover the main surface of the semiconductor substrate 100. Further, the word line layer 165 is preferably formed of polysilicon having an N conductivity type and a metal silicide layer stacked thereon. Alternatively, the word line layer 165 may be polysilicon having an N conductivity type. In the peripheral circuit region except for the DRAM cell array region 200, the word line layer 165 may be formed of polysilicon having an N type or a P conductivity type.

By using the word line insulating layer 162 as an etching stop layer, photolithography and etching processes are sequentially performed in the word line capping layer 168 and the word line layer 165. The photolithography and etching processes form first and second word line patterns 172, 174 on the word line insulating layer 162. Each of the first and second word line patterns 172, 174 is formed of a word line 166 and a word line capping layer pattern 169 stacked thereon. The first word line patterns 172 are formed on the active region 115 and spaced away from each other, so that the word lines 166 of the first word patterns 172 fill the upper portions (channel holes) of the channel-portion holes 154, respectively. The second word line patterns 174 are formed on the word line insulating layer 162 respectively in parallel and opposite to at least one of the first word line patterns 172. The first and the second word line patterns 172, 174 function as gate of a transistor.

Word line spacers 176 are formed on sidewalls of the first and the second word line patterns 172, 174, respectively. The word line spacers 176 are formed to expose the semiconductor substrate 100 between them, and thus, word line insulating layer patterns 163 are formed under the word line spacers 176 as well as under the first and the second word line patterns 172, 174, respectively. The word line spacers 176 are preferably formed of an insulating layer having the same etching ratio as that of the word line capping layer pattern 169.

By using the word line spacers 176 along with the first and the second word line patterns 172, 174 as a mask, an ion implantation process 180 is performed in the semiconductor substrate, 100 to form electrode impurity regions 185. The electrode impurity regions 185 are formed to overlap the first and the second word line patterns 172, 174. Further, the electrode impurity regions 185 are preferably formed to have a conductivity type different from that of the semiconductor substrate 100. The electrode impurity regions 185 define a source and a drain regions of the transistor, respectively.

Figure 15:
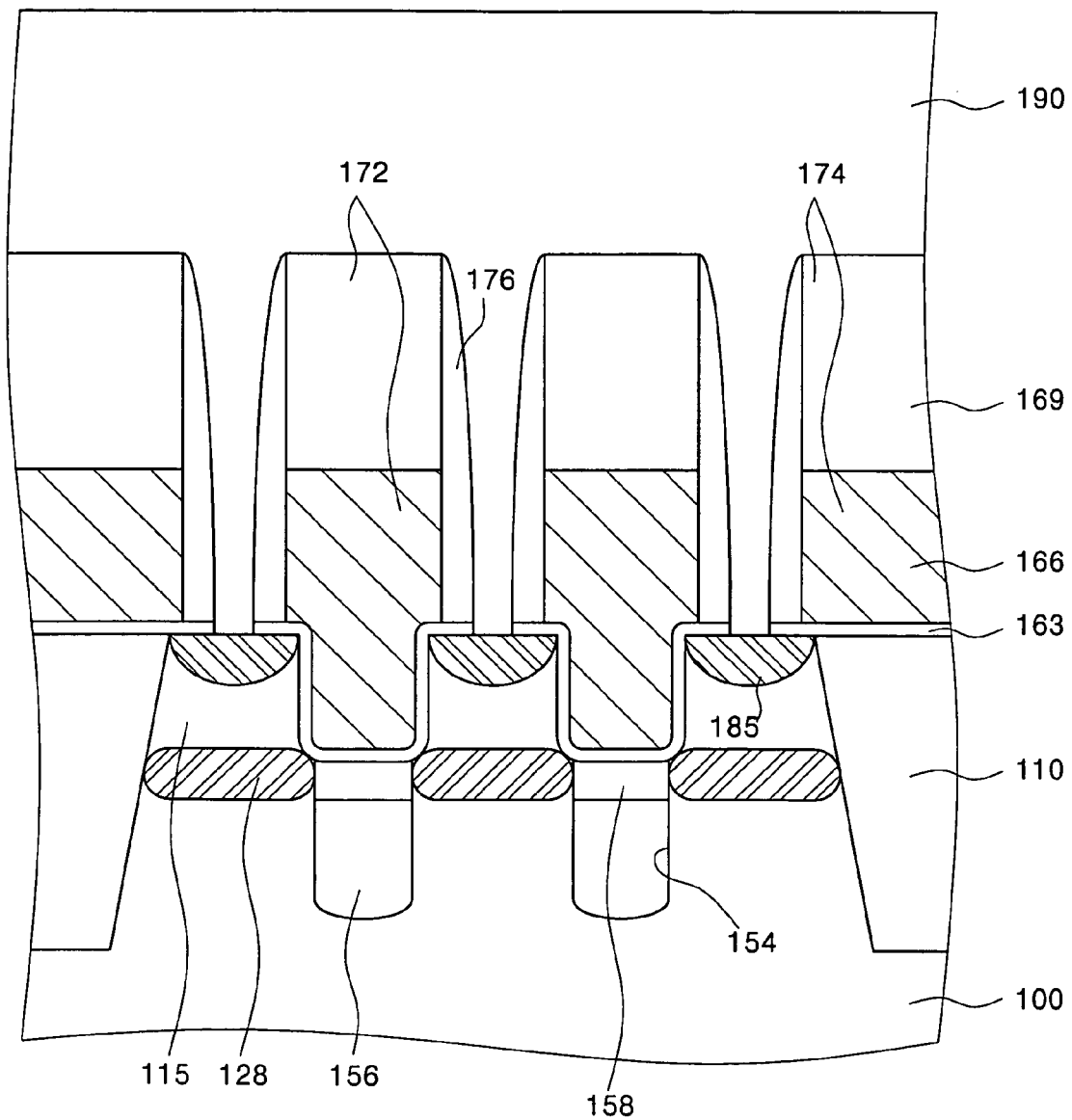
Figure 16:
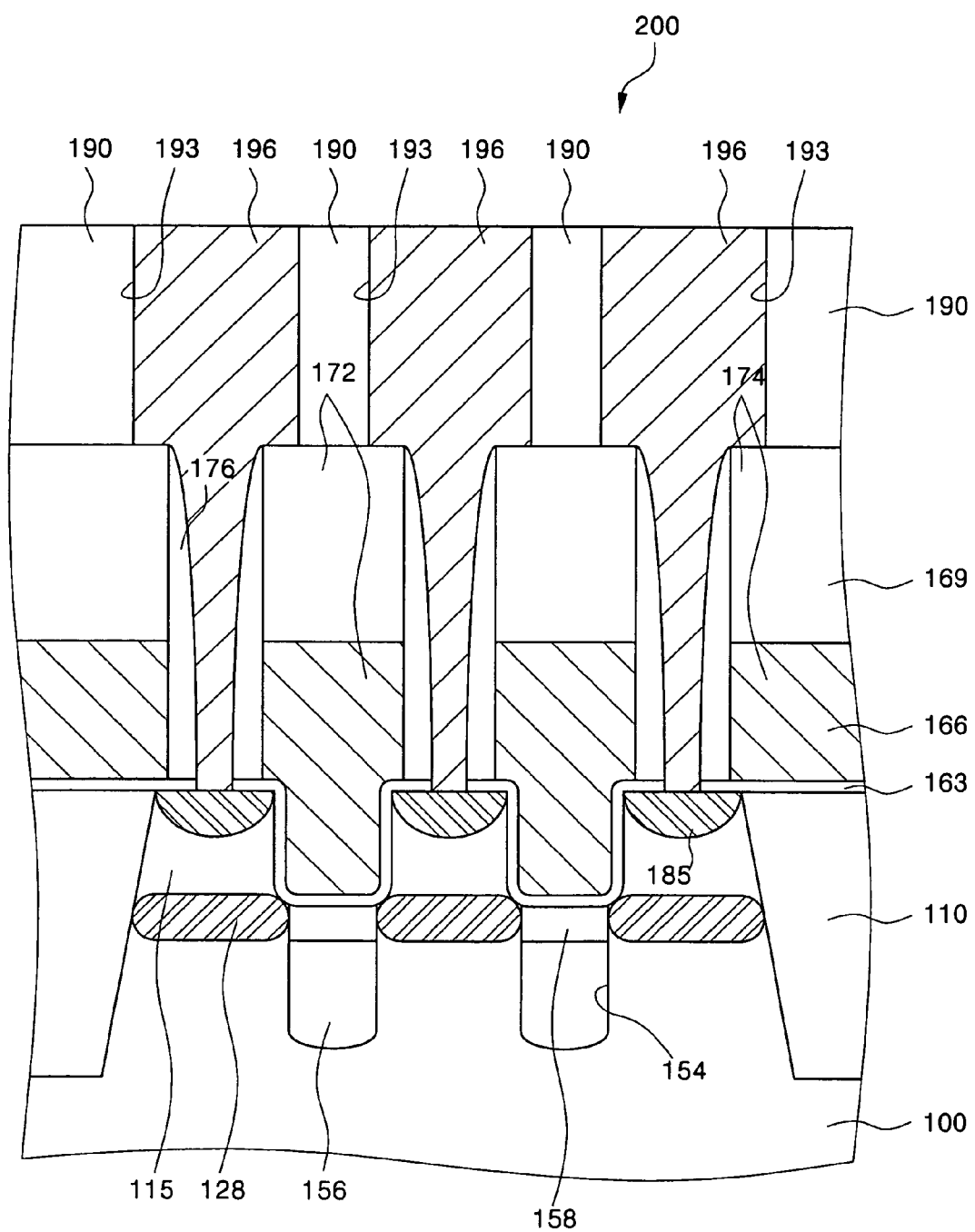

Referring to FIG. 1 and FIGS. 15 and 16, an interlayer insulating layer 190 is formed on the semiconductor substrate having the electrode impurity regions 185, and the interlayer insulating layer 190 is formed to sufficiently cover the first and the second word line patterns 172, 174. The interlayer insulating layer 190 is formed of an insulating layer having an etching ratio different from that of the word line spacer 176.

By using the word line capping layer patterns 169 and the word line spacers 176 as an etching stop layer, an etching process is performed in the interlayer insulating layer 190 to form plug contact holes 193. The plug contact holes 193 are formed between the first and the second word line patterns 172, 174 to penetrate the interlayer insulating layer 190. Upper portions of the plug contact holes 193 are preferably formed to have a diameter greater than that of lower portions thereof.

The plug contact holes 193 are filled with plug patterns 196, respectively, and the plug patterns 196 contact the electrode impurity regions 185, respectively. The plug patterns 196 are formed to have the same conductivity type as that of the electrode impurity regions 185.

The plug patterns 196 may be classified into capacitor and bit-line nodes, and the capacitor and the bit-line nodes are described as follows. The bit-line node is formed to have the plug pattern 196 between two consecutive first word line patterns 172, and the capacitor nodes are formed to have the remaining plug patterns 196 between the first and the second word line patterns 172, 174, respectively. The plug patterns 196 form the electrical nodes of the source and the drain regions, respectively.

As a result, the DRAM of an embodiment of the invention uses the sidewall of the channel-portion hole 154 and the channel-portion layer 158 as a channel region, and uses the punchthrough protection layer 156 as a physical means of preventing the punchthrough between the source and the drain regions. Therefore, the characteristics of the DRAM can be improved by preventing the punchthrough around the channel-portion hole 154 (channel region) and the bulk punchthrough through the semiconductor substrate 100 during the operation of the transistor.

Furthermore, since the punchthrough between the source and the drain regions of the transistor can be completely controlled according to a DRAM of an embodiment of the invention, the number of times an ion implantation processes occurring around the channel-portion hole 154 is reduced. Therefore, the DRAM having the punchthrough protection layer 156 can reduce a leakage current related to the capacitor, thereby improving refresh characteristics.

As described above, the invention provides a way of preventing the punchthrough between the source and the drain regions of the transistor by the punchthrough protection layer at the lower portion of the channel-portion hole. Therefore, the semiconductor device having such a punchthrough protection layer can exhibit current characteristics sufficient to meet the desires of users.

Embodiments of the invention will now be described in a non-limiting way.

Embodiments of the invention provide transistors of a semiconductor device and a DRAM cell having a punchthrough protection layer and methods of forming the same.

According to some embodiments of the invention, there are provided transistors of a semiconductor device having a punchthrough protection layer that include a channel-portion hole extending downward from a main surface of a semiconductor substrate. A punchthrough protection layer and a channel-portion layer are sequentially stacked at a lower portion of the channel-portion hole. A word line pattern fills an upper portion of the channel-portion hole and is disposed on the semiconductor substrate. The word line pattern includes a word line and a word line capping layer pattern stacked thereon, and the channel-portion layer is a channel region.

According to some embodiments of the invention, there are provided transistors of a DRAM cell having a punchthrough protection layer that include an active region isolated by a device isolation layer. At least two channel-portion holes extend downward from a main surface of a semiconductor substrate of the active region. A punchthrough protection layer and a channel-portion layer are sequentially stacked at a lower portion of each of the channel-portion holes. First word line patterns fill upper portions of the channel-portion holes, respectively, being disposed in parallel on the active region, and spaced away from each other. Second word line patterns are disposed on the device isolation layer adjacent to the active region, and disposed in parallel and opposite to at least one of the first word line patterns. Each of the first and the second word line patterns includes a word line and a word line capping layer pattern stacked thereon, and the channel-portion layer is a channel region.

According to some embodiments of the invention, there are provided methods of forming a semiconductor device having a punchthrough protection layer that include forming a channel hole extending downward from a main surface of a semiconductor substrate. A channel-portion trench is filled with a punchthrough protection layer under the channel hole. The punchthrough protection layer is formed to expose an upper sidewall of the channel-portion trench. A channel-portion layer covers the upper sidewall of the channel-portion trench to fill the channel-portion trench. A word line pattern is formed on the semiconductor substrate to fill the channel hole. The channel hole and the channel-portion trench form a channel-portion hole.

According to some embodiments of the invention, there are provided methods of forming a DRAM cell having a punchthrough protection layer that includes forming an active region isolated by a device isolation layer. At least two channel holes extend downward from a main surface of a semiconductor substrate. A channel-portion trench is filled with a punchthrough protection layer under each of the channel holes. The punchthrough protection layer is formed to expose an upper sidewall of the channel-portion trench. A channel-portion layer covers the upper sidewall of the channel-portion trench to fill the channel-portion trench. First and second word line patterns are disposed on the active region and the device isolation layer, respectively. The second word line patterns are disposed opposite to at least one of the first word line patterns, and concurrently, each of the first word line patterns are formed on the channel-portion layer to fill the channel hole. The first word line patterns are disposed in parallel on the main surface of the semiconductor substrate of the active region and spaced away from each other, and each of the channel holes and the channel-portion trenches form a channel-portion hole.

What is claimed is:

1. A method of forming a transistor of a semiconductor device comprising:
    forming a channel hole extending downward from a main surface of a semiconductor substrate;
    forming a channel-portion trench filled with a punchthrough protection layer under the channel hole, the punchthrough protection layer being formed to expose an upper sidewall of the channel-portion trench;
    forming a channel-portion layer covering the upper sidewall of the channel-portion trench to fill the channel-portion trench; and
    forming a word line pattern on the semiconductor substrate to fill the channel hole, in which
    the channel hole and the channel-portion trench form a channel-portion hole.

2. The method according to claim 1, wherein the punchthrough protection layer is formed of an insulating layer having an etching ratio different from that of the semiconductor substrate.

3. The method according to claim 1, wherein the channel-portion layer is formed of an insulating layer having the same etching ratio as that of the semiconductor substrate.

4. The method according to claim 1, wherein the channel hole and the channel-portion trench are formed to have widths different from each other.

5. The method according to claim 1, wherein the channel hole and the channel-portion trench are formed to have a same width.

6. The method according to claim 1, further comprising forming a word line insulating layer pattern on the channel-portion layer to conformably cover the channel hole.

7. The method according to claim 1, further comprising forming channel impurity division regions at the upper sidewall of the channel-portion trench to contact the channel-portion layer.

8. The method according to claim 1, further comprising:
    forming word line spacers on sidewalls of the word line pattern;
    forming electrode impurity regions respectively overlapping ends of the word line patterns, and concurrently, being formed under the main surface of the semiconductor substrate; and
    forming an interlayer insulating layer on the semiconductor substrate having the electrode impurity regions, in which
    the word line pattern is formed to have a word line and a word line capping layer pattern stacked thereon, and the word line spacer is formed of an insulating layer having the same etching ratio as that of the word line capping layer pattern.

9. The method according to claim 8, wherein the interlayer insulating layer and the word line spacers are formed to have etching ratios different from each other.

10. The method according to claim 8, further comprising:
    forming plug contact holes at both sides of the word line patterns to penetrate the interlayer insulating layer to expose the electrode impurity regions; and
    forming plug patterns respectively filling the plug contact holes.

11. The method according to claim 10, wherein the plug patterns and the electrode impurity regions are formed to have a same conductivity type.

12. A method of forming a transistor of a DRAM cell comprising:
    forming an active region isolated by a device isolation layer;
    forming at least two channel holes extending downward from a main surface of a semiconductor substrate;
    forming a channel-portion trench filled with a punchthrough protection layer under each of the channel holes, the punchthrough protection layer being formed to expose an upper sidewall of the channel-portion trench;
    forming a channel-portion layer that covers the upper sidewall of the channel-portion trench to fill the channel-portion trench; and
    forming first and second word line patterns disposed on the active region and the device isolation layer, respectively, the second word line patterns being disposed opposite to at least one of the first word line patterns, each of the first word line patterns being formed on the channel-portion layer to fill each of the channel holes, in which the first word line patterns are disposed in parallel on the main surface of the semiconductor substrate of the active region and spaced away from each other, and each of the channel holes and the channel-portion trench form a channel-portion hole.

13. The method according to claim 12, wherein the device isolation layer is formed to have the same etching ratio as that of the punchthrough protection layer.

14. The method according to claim 12, wherein the punchthrough protection layer is formed of an insulating layer having an etching ratio different from that of the semiconductor substrate.

15. The method according to claim 12, wherein the channel-portion layer is formed of an insulating layer having the same etching ratio as that of the semiconductor substrate.

16. The method according to claim 12, wherein each of the channel holes and the channel-portion trench are formed to have widths different from each other.

17. The method according to claim 12, wherein each of the channel holes and the channel-portion trench are formed to have a same width.

18. The method according to claim 12, further comprising forming a word line insulating layer pattern on the channel-portion layer to conformably cover the channel holes.

19. The method according to claim 12, further comprising forming channel impurity division regions at the upper sidewall of the channel-portion trench to contact the channel-portion layer.

20. The method according to claim 12, further comprising:
forming word line spacers respectively on sidewalls of the first and the second word line patterns;
forming electrode impurity regions under the main surface of the semiconductor substrate between the first and the second word line patterns; and
forming an interlayer insulating layer on the semiconductor substrate having the electrode impurity regions, in which
each of the first and the second word line patterns is formed to have a word line and a word line capping layer pattern stacked thereon, and the word line spacer is formed of an insulating layer having the same etching ratio as the word line capping layer pattern.

21. The method according to claim 20, wherein the interlayer insulating layer and the word line spacers are formed to have etching ratios different from each other.

22. The method according to claim 20, further comprising:
forming plug contact holes between the first and the second word line patterns to penetrate the interlayer insulating layer, and to expose the electrode impurity regions; and
forming plug patterns respectively filling the plug contact holes.

23. The method according to claim 22, wherein the plug patterns and the electrode impurity regions are formed to have a same conductivity type.

* * * * *